(12) United States Patent
Nishi et al.

(10) Patent No.: US 6,500,051 B1
(45) Date of Patent: *Dec. 31, 2002

(54) POLISHING APPARATUS AND METHOD

(75) Inventors: Toyomi Nishi, Yokohama (JP); Tetsuji Togawa, Fujisawa (JP); Harumitsu Saito, Yokohama (JP); Manabu Tsujimura, Yokohama (JP); Hiromi Yajima, Yokohama (JP); Kazuaki Himukai, Chigasaki (JP); Shoichi Kodama, Tokyo (JP); Yukio Imoto, Zama (JP); Riichiro Aoki, Tokyo (JP); Masako Watase, Yokohama (JP); Atsushi Shigeta, Fujisawa (JP); Shiro Mishima, Yokkaichi (JP); Gisuke Kouno, Oita (JP)

(73) Assignees: Ebara Corporation, Tokyo (JP); Kabushiki Kaisha Toshiba, Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/884,410

(22) Filed: Jun. 27, 1997

Related U.S. Application Data

(63) Continuation of application No. 08/563,295, filed on Nov. 28, 1995, now Pat. No. 5,679,059.

(30) Foreign Application Priority Data

Nov. 29, 1994 (JP) ............................................. 6-319289
Dec. 6, 1994 (JP) ............................................. 6-330209
Dec. 6, 1994 (JP) ............................................. 6-330210

(51) Int. Cl.$^7$ ................................................. B24B 1/00
(52) U.S. Cl. ........................ 451/41; 451/285; 451/288; 451/286; 451/287; 451/289

(58) Field of Search ...................................... 451/67, 73

(56) References Cited

U.S. PATENT DOCUMENTS 4,050,954 A 9/1977 Basi (List continued on next page.)

FOREIGN PATENT DOCUMENTS

| JP | 60-8189 | 3/1985 |
| JP | 63-207559 | 8/1988 |
| JP | 6-252110 | 9/1994 |

OTHER PUBLICATIONS

Co–pending U.S. Patent Application Serial No. 08/767,060, filed Dec. 16, 1996, entitled "Method and Apparatus for Dry–In, Dry–Out Polishing and Washing of a Semiconductor Device", located in Group Art Unit 3723.

Primary Examiner—Robert A. Rose
Assistant Examiner—George Nguyen
(74) Attorney, Agent, or Firm—Wenderoth, Lind & Ponack, L.L.P.

(57) ABSTRACT

A polishing apparatus for polishing a surface of a workpiece includes a housing unit, a partition wall partitioning an interior of the housing unit into a first chamber and a second chamber, a polishing section disposed in the first chamber and having a turntable with an abrasive cloth mounted on an upper surface thereof and a top ring positioned above the turntable for supporting the workpiece to be polished and pressing the workpiece against the abrasive cloth, and a cleaning section disposed in the second chamber and cleaning the workpiece which has been polished. The polishing apparatus further includes a transferring device for transferring the workpiece which has been polished from the polishing section to the cleaning section through an opening and an exhaust system for exhausting ambient air from each of the polishing section and cleaning section separately and independently.

63 Claims, 11 Drawing Sheets

U.S. PATENT DOCUMENTS

| | | |
|---|---|---|
| 4,838,150 A | 6/1989 | Suzuki et al. |
| 5,096,477 A | 3/1992 | Shinoda et al. |
| 5,299,584 A | 4/1994 | Miyazaki et al. |
| 5,329,732 A | 7/1994 | Karlsrud et al. |
| 5,425,793 A | 6/1995 | Mori et al. |
| 5,431,600 A | 7/1995 | Murata et al. |
| 5,655,954 A | 8/1997 | Oishi et al. |
| 5,779,520 A | 7/1998 | Hayakawa |

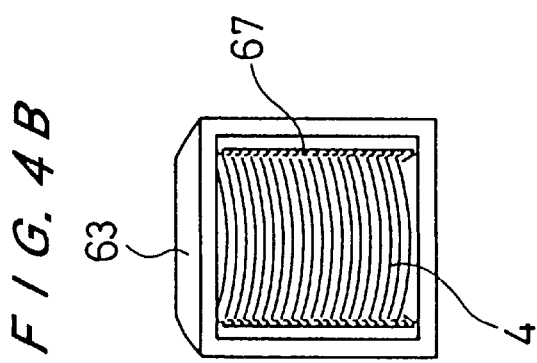
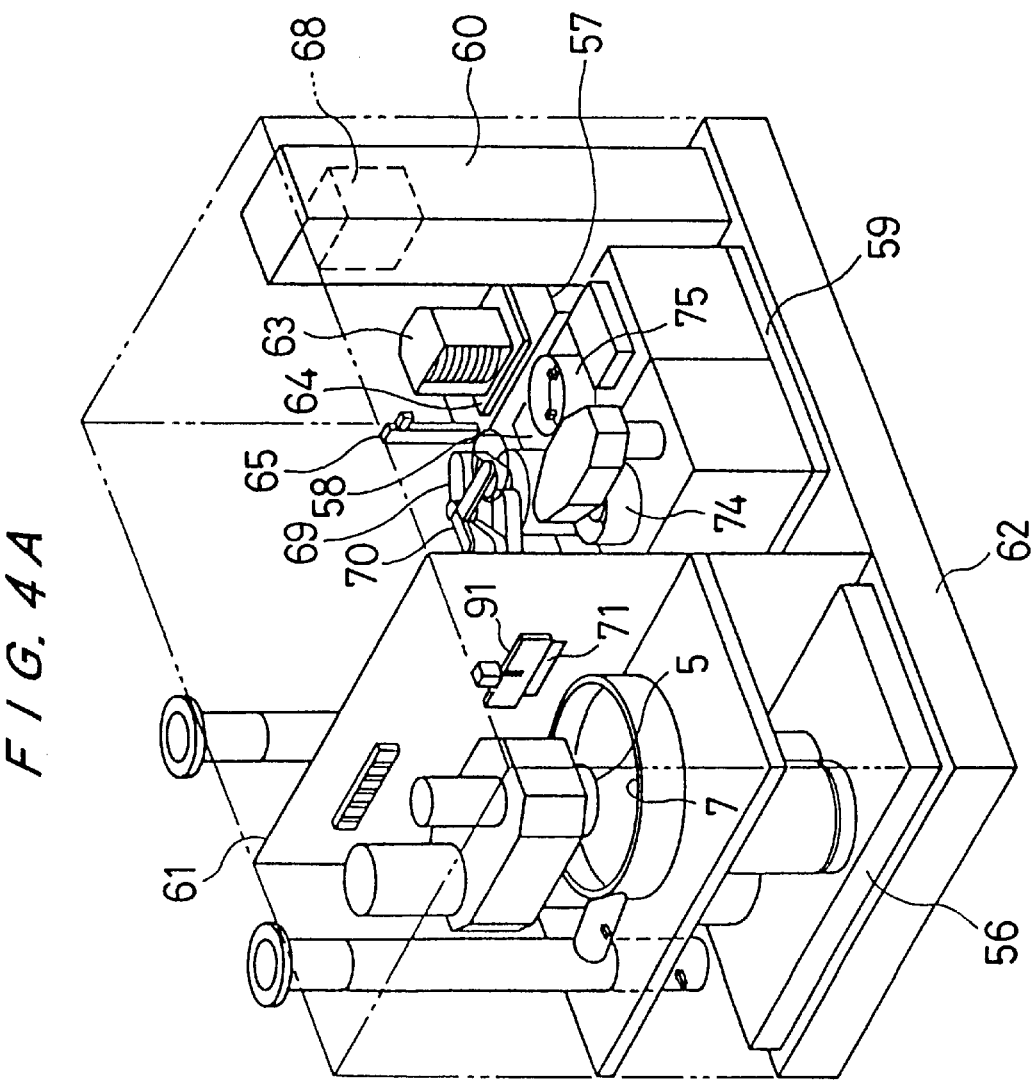

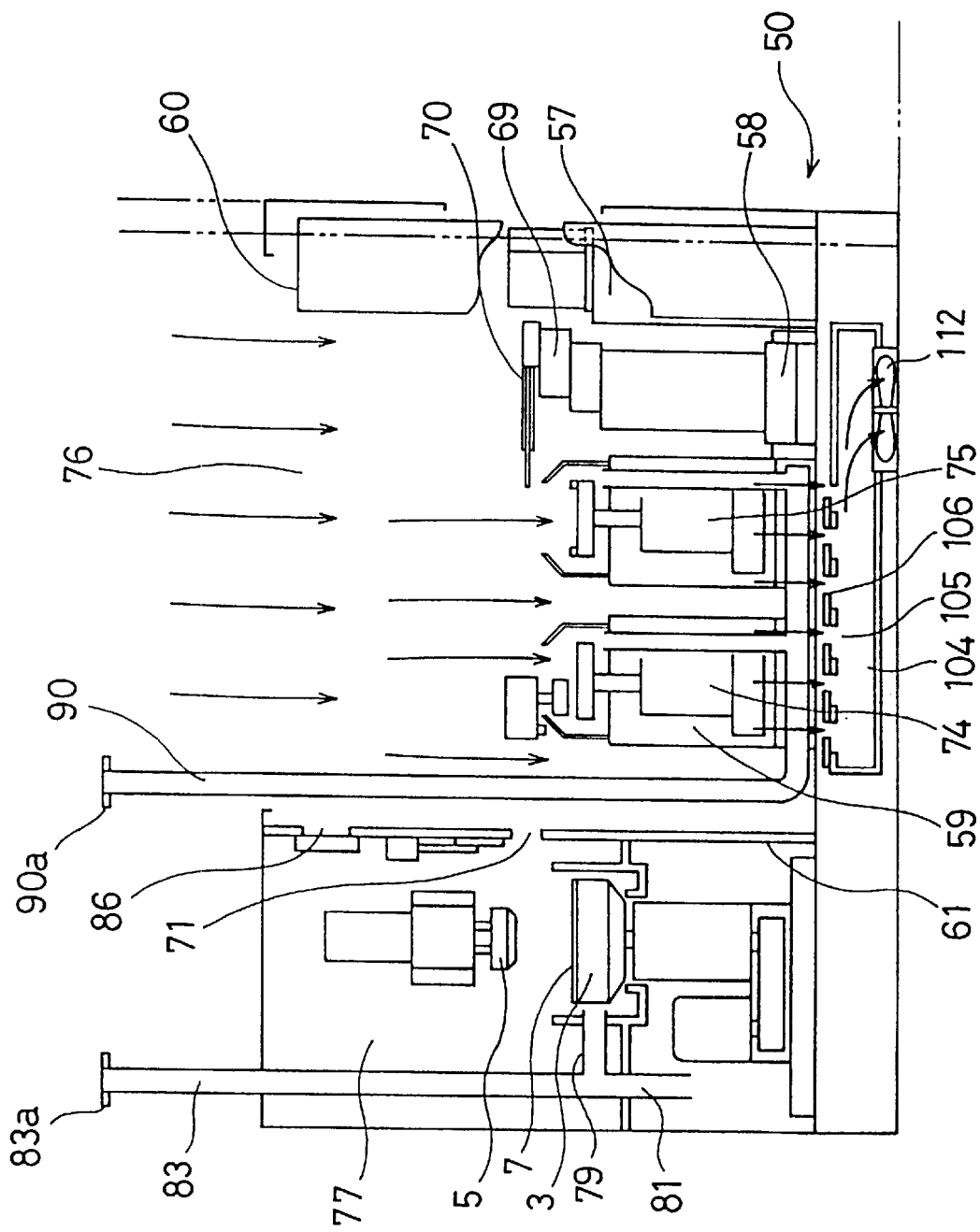

POLISHING APPARATUS AND METHOD

This is a continuation of application Ser. No. 08/563,295 filed Nov. 28, 1995, now U.S. Pat. No. 5,679,059.

BACKGROUND OF THE INVENTION

1. Field of the Invention

The present invention relates to a polishing apparatus, and more particularly to a polishing apparatus having a polishing section for polishing a workpiece such as a semiconductor wafer to a flat mirror finish and a cleaning section for cleaning the workpiece which has been polished.

2. Description of the Related Art

Recent rapid progress in semiconductor device integration demands smaller and smaller wiring patterns or interconnections and also narrower spaces between interconnections which connect active areas. One of the processes available for forming such interconnections is photolithography. Though the photolithographic process can form interconnections that are at most 0.5 μm wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus.

Conventionally, a polishing apparatus has a turntable and a top ring which rotate at respective individual speeds. An abrasive cloth is attached to the upper surface of the turntable. A semiconductor wafer to be polished is placed on the abrasive cloth and clamped between the top ring and the turntable. During operation, the top ring exerts a certain pressure on the turntable, and the surface of the semiconductor wafer held against the abrasive cloth is therefore polished to a flat mirror finish while the top ring and the turntable are rotating.

Further, in the polishing apparatus, abrasive slurry is supplied from a nozzle onto the abrasive cloth attached to the upper surface of the turntable. The abrasive slurry contains abrasive material such as silicon dioxide ($SiO_2$) or cerium dioxide ($CeO_2$) having a diameter of 1 μm or less in a liquid. The abrasive slurry contains water, abrasive material, and a small amount of dispersing agent to prevent aggregation of the abrasive material. Further, in order to perform chemical polishing in addition to mechanical polishing, acid or alkali may be added to the abrasive slurry.

The surface of the semiconductor wafer which has been polished is generally quite contaminated not only with particles of semiconductor material but also with abrasive material. The count of contaminants on the surface of the semiconductor wafer may be as high as 100,000 particles per wafer, and it is required to reduce this count to about 100 particles per wafer by some efficient method.

The conventional polishing apparatus could not be placed in a clean room because of dust particles generated by the polishing apparatus itself. Once the contaminants which adhere to the surface of the polished semiconductor wafer have been dried, it is difficult to remove the contaminants by cleaning. Therefore, the present practice is to preserve the semiconductor wafers which have been polished in water, immediately after polishing, in a specially constructed water-containing carrier which is brought into the clean room so that the semiconductor wafers may be cleaned in a cleaning device.

However, in the conventional apparatus, the cleaning device is spaced from the polishing apparatus and the semiconductor wafers must be transferred from the polishing apparatus to the cleaning device in such a state that they are preserved in water, thus productivity of the semiconductor wafers are lowered. Further, because the cleaning device itself becomes quite polluted from the dust particles adhering to the semiconductor wafers, it is not possible to use general cleaning devices provided in the clean room. That is, a special cleaning machine must be provided for exclusively cleaning the semiconductor wafers which have been polished. This leads to high apparatus cost.

SUMMARY OF THE INVENTION

It is therefore an object of the present invention to provide a polishing apparatus which can be installed in a clean room and does not contaminate the ambient atmosphere in the clean room, and which can polish, clean and dry workpieces such as semiconductor wafers so that the workpieces can be discharged to a next processing station by using regular carriers available generally in the clean room.

Another object of the present invention is to provide a polishing apparatus which can prevent particulate contamination originating in polishing activities so that the polishing apparatus can be installed in a clean room.

According to one aspect of the present invention, there is provided a polishing apparatus for polishing a surface of a workpiece comprising: a housing unit; a partition wall partitioning an interior of the housing unit into a first chamber and a second chamber, the partition wall having a first opening for allowing the workpiece to pass therethrough; a polishing section having a turntable with an abrasive cloth mounted on an upper surface thereof and a top ring positioned above the turntable for supporting the workpiece to be polished and pressing the workpiece against the abrasive cloth, the polishing section being disposed in the first chamber; a cleaning section for cleaning the workpiece which has been polished, the cleaning section being disposed in the second chamber; a transferring device for transferring the workpiece which has been polished from the polishing section to the cleaning section through the first opening; and exhaust means for exhausting ambient air from each of the polishing section and the cleaning section separately and independently.

According to the polishing apparatus presented above, the polishing section and the cleaning section are housed in the housing unit, and the two sections are isolated from each other by the partition wall. Therefore, the entire polishing apparatus can be disposed in a clean room without contaminating the clean room atmosphere. The semiconductor wafers can be polished and cleaned within the polishing apparatus, and transferred to the next processing stations using regular carriers available in the clean room generally. The two sections of the polishing apparatus are separated by the partition wall having the opening which is closed with a shutter, and the ambient atmospheres in the polishing section and the cleaning section are exhausted separately and independently. This arrangement prevents any dust particles such as mist of abrasive slurry and ground-off material generated during a polishing operation from contaminating the clean room by either maintaining the polishing section at a pressure lower than the cleaning section or by closing a shutter which is provided for the opening of the partition wall.

According to another aspect of the present invention, there is provided a polishing apparatus for polishing a surface of a workpiece comprising: a housing unit; a partition wall partitioning an interior of the housing unit into a first chamber and a second chamber, the partition wall having a first opening for allowing the workpiece to pass therethrough; a polishing section having a turntable with an abrasive cloth mounted on an upper surface thereof and a top ring positioned above the turntable for supporting the workpiece to be polished and pressing the workpiece against the abrasive cloth, the polishing section being disposed in said first chamber; a cleaning section for cleaning the workpiece which has been polished, the cleaning section being disposed in the second chamber; a transferring device for transferring the workpiece which has been polished from the polishing section to the cleaning section through the first opening; and exhaust means for exhausting ambient air from each of the polishing section and the cleaning section; wherein the cleaning section comprises a cleaning unit for cleaning the workpiece while supplying cleaning solvent and a drying unit for drying the workpiece which has been cleaned.

According to the polishing apparatus presented above, a workpiece such as a semiconductor wafer is polished in the polishing section, the workpiece which has been polished is transferred from the polishing section to the cleaning section, and then the workpiece is cleaned and dried in the cleaning section. Therefore, the workpiece is discharged from the polishing apparatus in such a state that the workpiece is clean and dry.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 4A is a perspective view of the interior of the polishing apparatus of FIG. 3;

FIG. 4B is a perspective view of a cassette shown in FIG. 4A;

FIG. 11 is a side view showing the internal arrangement of a polishing apparatus according to a modified embodiment of the third embodiment of the present invention.

DETAILED DESCRIPTION OF THE PREFERRED EMBODIMENT

A polishing apparatus according to a first embodiment of the present invention will be described below with reference to FIGS. 1 and 2.

Figure 1:
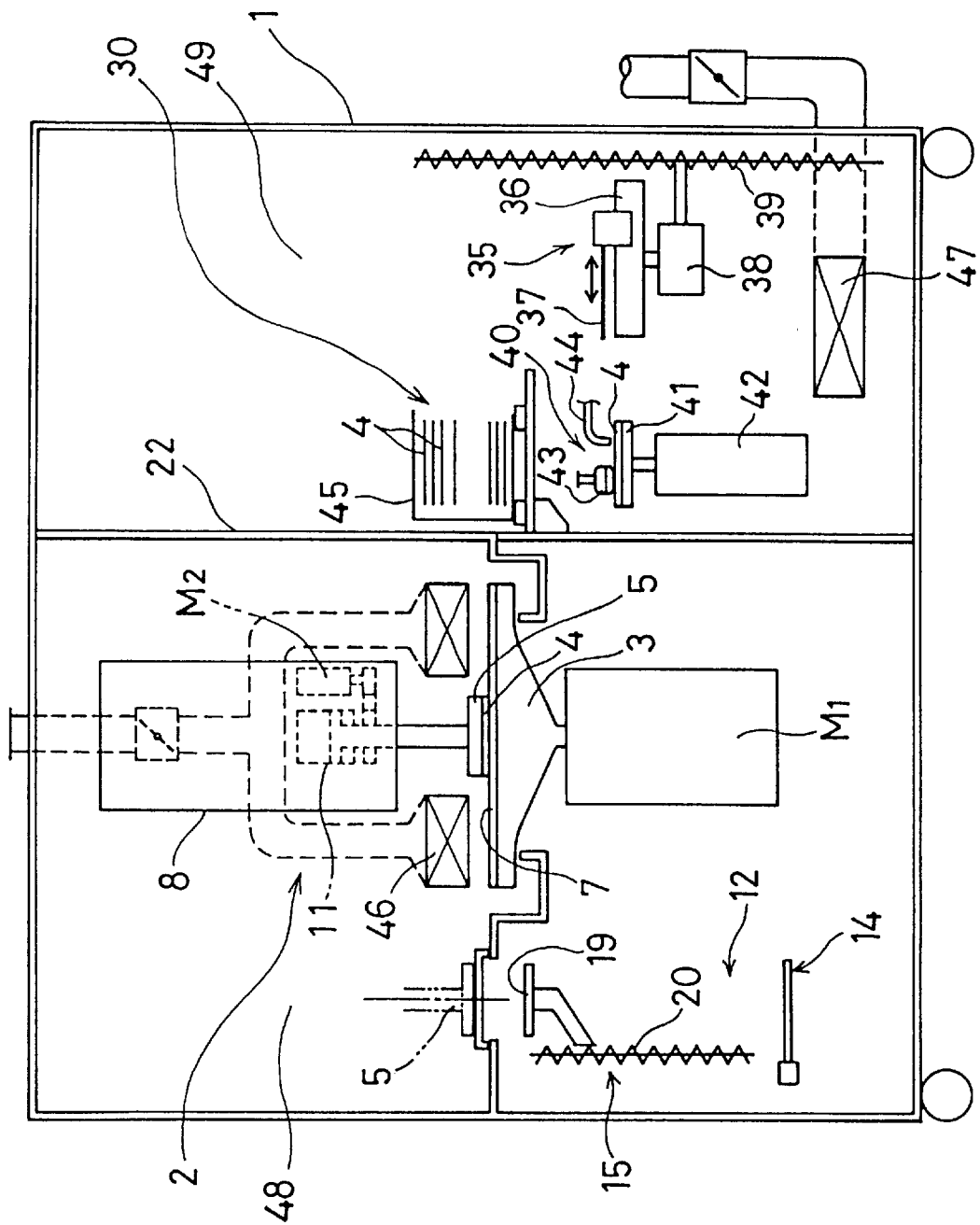
FIG. 1 is an elevational cross-sectional view of a polishing apparatus according to a first embodiment of the present invention.
Figure 2:
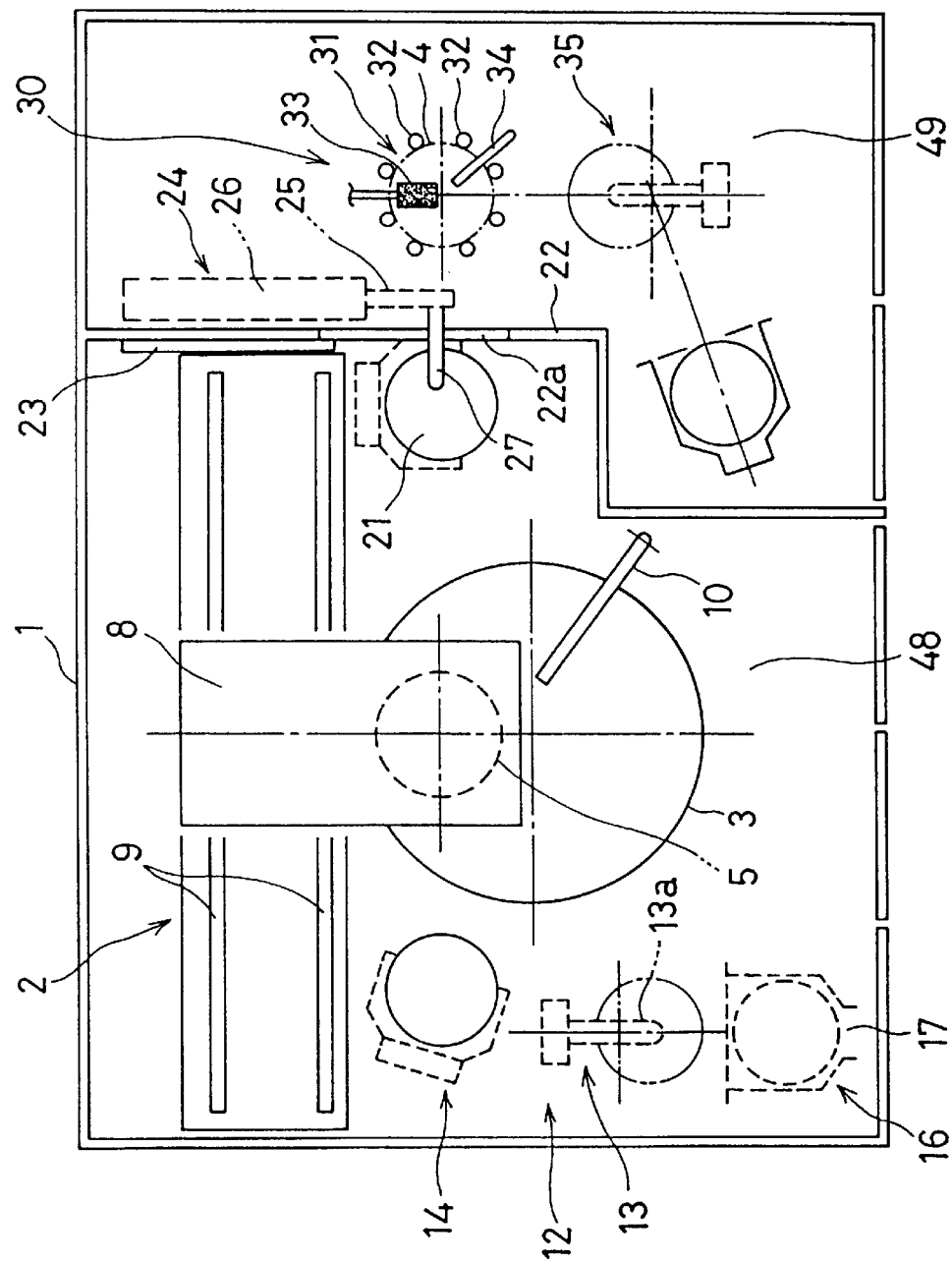
FIG. 2 is a cross-sectional plan view of the polishing apparatus according to the first embodiment of the present invention.

As shown in FIGS. 1 and 2, a polishing apparatus has a housing unit 1 with side walls, a top wall and a bottom wall housing a polishing section 2 for polishing semiconductor wafers and a cleaning section 30 for cleaning the semiconductor wafers which have been polished. The interior of the housing unit 1 is partitioned by a partition wall 22 into a first chamber 48 and a second chamber 49. The polishing section 2 is disposed in the first chamber 48, and the cleaning section 30 is disposed in the second chamber 49.

The polishing section 2 comprises a turntable 3 and a top ring 5 for holding a semiconductor wafer 4 and pressing the semiconductor wafer 4 against the turntable 3. The turntable 3 is coupled to a motor $M_1$. An abrasive cloth 7 is attached to an upper surface of the turntable 3. The top ring 5 is coupled to a top ring head 8 which is provided with a top ring motor $M_2$ for rotating the top ring 5 and an air cylinder 11 for moving the top ring 5 vertically, whereby the top ring 5 is movable up and down and rotatable about an axis of the top ring 5. The top ring head 8 is movable across the turntable 3 along guide rails 9. An abrasive slurry containing abrasive material such as silicon dioxide ($SiO_2$) or cerium dioxide ($CeO_2$) is supplied from a nozzle 10 onto the upper surface of the abrasive cloth 7.

A loading device 12 for supplying the semiconductor wafer 4 to the top ring 5 comprises a first transfer unit 13, an inverter 14 and a second transfer unit 15. The first transfer unit 13 takes out the semiconductor wafer 4 from a cassette 17 placed at a cassette station 16, and transfers the semiconductor wafer 4 to the inverter 14 which inverts the semiconductor wafer 4 so that the surface to be polished faces downward. The inverted semiconductor wafer 4 is received by the first transfer unit 13 and transferred to the second transfer unit 15.

The second transfer unit 15 comprises a wafer holding member 19 for holding the semiconductor wafer 4 and a screw rod 20 for moving the wafer holding member 19 vertically, and transfers the semiconductor wafer 4 supplied from the first transfer unit 13 to the top ring 5.

The semiconductor wafer 4 is then polished by pressing the semiconductor wafer 4 against the abrasive cloth 7 on the turntable 3. After polishing is completed, the semiconductor wafer 4 is transferred to a position above a wafer supporting station 21 by the top ring 5 which moves integrally with the top ring head 8 along the guide rails 9. The semiconductor wafer 4 is removed from the top ring 5 and placed on the wafer supporting station 21.

The partition wall 22 which separates the polishing section 2 from the cleaning section 30 has an opening 22a. A shutter 23 is disposed at the opening 22a to act as a door for the opening 22a. An inverter 24 is disposed adjacent to the partition wall 22. The inverter 24 comprises an inverter shaft 25, an inverter actuator 26 and an inverter arm 27. The arm 27 is rotated by the actuator 26 through the inverter shaft 25.

When the shutter 23 is open, the inverter arm 27 rotates and holds the semiconductor wafer 4 placed on the wafer supporting station 21 by vacuum suction, and the semiconductor wafer 4 is inverted while it is transferred to the cleaning section 30 by the reverse rotation of the inverter arm 27 through the opening 22a.

The cleaning section 30 comprises a first-stage cleaning unit 31 for performing a primary cleaning of the semiconductor wafer 4 which has been polished, and a second-stage cleaning unit 40 for performing a secondary cleaning of the semiconductor wafer 4. The first-stage cleaning unit 31 comprises a plurality of rollers 32 for holding the outer periphery of the semiconductor wafer 4 and rotating the semiconductor wafer 4, a sponge roller 33 for scrubbing the semiconductor wafer 4, and a cleaning solvent supply pipe 34 for supplying cleaning solvent such as water to the semiconductor wafer 4. While the semiconductor wafer 4 is held by the rollers 32, the semiconductor wafer 4 is rotated by the rollers 32 driven by a motor (not shown). The primary cleaning process is carried out by pressing the sponge roller 33 against the semiconductor wafer 4 while cleaning solvent is supplied to the semiconductor from the cleaning solvent supply pipe 34. The semiconductor wafer 4 which has been subjected to the primary cleaning is transferred to the second-stage cleaning unit 40 by a third transfer unit 35.

The third transfer unit 35 comprises a wafer holding station 36, a wafer holding member 37 disposed above the wafer holding station 36, a motor 38 for rotating the wafer holding station 36 and a screw rod 39 for moving the wafer holding station 36 vertically. The wafer holding member 37 moves in the horizontal direction indicated by an arrow in FIG. 1 and performs handling of the semiconductor wafer 4 positioned away from the wafer holding station 36. After receiving the semiconductor wafer 4 which has been subjected to the primary cleaning, the third transfer unit 35 retracts the wafer holding member 37, and moves the semiconductor wafer 4 to a position above the wafer holding station 36. Thereafter, the third transfer unit 35 lowers the wafer holding station 36 while rotating the wafer holding station 36, and transfers the semiconductor wafer 4 to the second-stage cleaning unit 40 by extending the wafer holding member 37 again.

The second-stage cleaning unit 40 comprises a wafer holding station 41, a motor 42 for rotating the wafer holding station 41, a cleaning sponge 43 for scrubbing the semiconductor wafer 4 and a cleaning solvent supply pipe 44 for supplying cleaning solvent such as water to the semiconductor wafer 4. The semiconductor wafer 4 is cleaned on the wafer holding station 41 by supplying cleaning solvent to the semiconductor wafer 4 from the cleaning solvent supply pipe 44 and pressing the cleaning sponge 43 against the semiconductor wafer 4. After the cleaning process is completed, the sponge 43 is retracted, the water supply is stopped, and the semiconductor wafer 4 is spin-dried by spinning the wafer holding station 41 at a high speed by the motor 42.

After the secondary cleaning and spin-drying are completed, the semiconductor wafer 4 is again received by the wafer holding member 37 of the third transfer unit 35, and is moved to a position above the wafer holding station 36. The wafer holding station 36 is raised while it is rotated, and the wafer holding member 37 is extended to store the semiconductor wafer 4 which has been polished, cleaned and dried in a cassette 45.

The polishing section 2 and the cleaning section 30 are provided with exhaust ducts 46 and 47, respectively for exhausting an ambient air in the polishing section 2 and the cleaning section 30 separately and independently.

The operation of the polishing apparatus in FIGS. 1 and 2 will be described below.

A semiconductor wafer 4 is taken out from the cassette 17 placed at the cassette station 16 by means of a tongue member 13a of the first transfer unit 13, and transferred to the inverter 14. The semiconductor wafer 4 is inverted by the inverter 14 so that the surface to be polished faces downward, received by the first transfer unit 13, and transferred onto the wafer holding member 19 of the second transfer unit 15.

Next, the top ring head 8 moves along the guide rails 9 so that the top ring 5 is positioned above the wafer holding member 19 of the second transfer unit 15. The wafer holding member 19 is then raised to transfer the semiconductor wafer 4 held thereon to the top ring 5.

The top ring 5 holds the semiconductor wafer 4, and moves to a polishing position above the turntable 3. The turntable 3 and the top ring 5 are rotated, and the abrasive slurry containing the abrasive material is supplied from the nozzle 10 to the upper surface of the abrasive cloth 7 on the turntable 3. The top ring 5 is lowered and presses the semiconductor wafer 4 against the abrasive cloth 7, thereby polishing the semiconductor wafer 4.

After polishing is completed, the top ring head 8 moves along the guide rails 9, and the top ring 5 holding the semiconductor wafer 4 is positioned directly above the wafer supporting station 21. Then, the semiconductor wafer 4 is removed from the top ring 5 and placed on the wafer supporting station 21. The top ring 5 now moves towards the second transfer unit 15 to carry out the next polishing operation of another semiconductor wafer 4.

When the semiconductor wafer 4 which has been polished is placed on the wafer supporting station 21, the shutter 23 is opened, and the inverter arm 27 of the inverter 24 is rotated and positioned above the semiconductor wafer 4 to pick up the semiconductor wafer 4 by vacuum suction. The semiconductor wafer 4 is then inverted by the reverse rotation of the arm 27, and transferred to the first-stage cleaning unit 31. At this time, the opening 22a of the partition wall 22 is in an open position to allow the arm 27 holding the semiconductor wafer 4 to pass therethrough. When the semiconductor wafer 4 and the arm 27 have passed through the opening 22a and moved completely into the cleaning section 30, the opening 22a is closed by closing the shutter 23.

After the semiconductor wafer 4 has been transferred to the first-stage cleaning unit 31 by the arm 27, the arm 27 retreats downward. In the first-stage cleaning unit 31, the semiconductor wafer 4 is held by the rollers 32 and rotated by the rollers 32. The primary cleaning is performed by rotating the semiconductor wafer 4 and pressing the sponge roller 33 against the semiconductor wafer 4 while supplying cleaning solvent from the cleaning solvent supply pipe 34 to the semiconductor wafer 4.

The semiconductor wafer 4 which has been subjected to the primary cleaning is received by the third transfer unit 35. After receiving the semiconductor wafer 4, the third transfer unit 35 retracts the wafer holding member 37 to position the semiconductor wafer 4 above the wafer holding station 36. Thereafter, the wafer holding station 36 is lowered while it is rotated, and the semiconductor wafer 4 is transferred to the second-stage cleaning unit 40 by extending the wafer holding member 37 again.

In the second-stage cleaning unit 40, the semiconductor wafer 4 is rotated by the wafer holding station 41, and cleaned by pressing the cleaning sponge 43 against the semiconductor wafer 4 while supplying the cleaning solvent to the semiconductor wafer 4 from the cleaning solvent supply pipe 44. After the secondary cleaning is completed, the cleaning sponge 43 is retracted, water supply is stopped, and the rotational speed of the motor 42 is increased to spin the wafer holding station 41 at a high speed, thereby spin-drying the semiconductor wafer 4.

The semiconductor wafer 4 which has been subjected to the secondary cleaning and drying is again received by the wafer holding member 37 of the third transfer unit 35. After the semiconductor wafer 4 is moved to a position above the wafer holding station 36, the wafer holding station 36 is raised while it is rotated, and the wafer holding member 37 is extended to transfer the semiconductor wafer 4 into the cassette 45.

In the polishing processes described above, the entry of mist of abrasive slurry and ground-off particles of the semiconductor wafer from the polishing section 2 to the cleaning section 30 is effectively prevented by the partition wall 22 disposed between the polishing section 2 and the cleaning section 30. In addition to such a structural feature of the polishing apparatus, separate exhaust systems including the exhaust ducts 46 and 47 are provided to prevent contamination in the cleaning section 30. By maintaining the interior pressure in the polishing section 2 to be lower than that in the cleaning section 30, it is possible to omit the shutter provided on the partition wall 22.

As is apparent from the foregoing description, since the polishing section 2 and the cleaning section 30 are housed in the housing unit 1 with the side walls, the top wall and the bottom wall, and separated from each other by the partition wall 22, it is possible to install the polishing apparatus in a clean room, and to polish and clean the semiconductor wafer 4 without contaminating the clean room atmosphere by the mist and the dust particles generated during polishing and cleaning operations. Further, a regular wafer carrier can be used in the clean room to transfer the polished, cleaned and dried semiconductor wafer to the next processing station.

Furthermore, since the polishing section 2 and the cleaning section 30 are separated by the partition wall 22 having the shutter 23, and separate exhaust systems including the ducts 46 and 47 are provided for each of the polishing section 2 and the cleaning section 30, the mist of the abrasive slurry and ground-off particles of the semiconductor wafer from the polishing section 2 are prevented from entering into the cleaning section 30.

A polishing apparatus according to a second embodiment of the present invention will be described below with reference to FIGS. 3 through 8.

Figure 3:
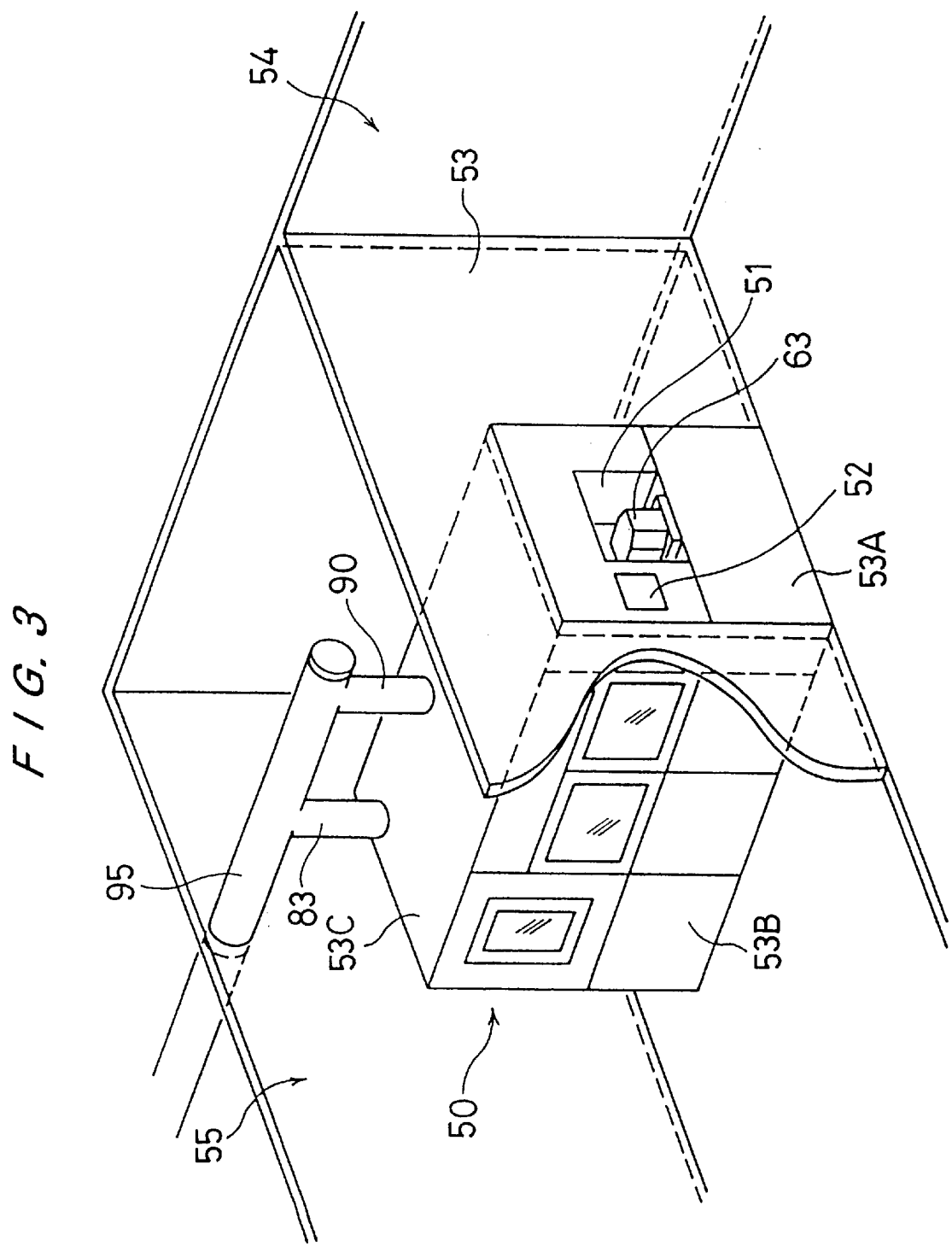
FIG. 3 is a perspective view of a polishing apparatus according to a second embodiment of the present invention.

FIG. 3 is a perspective view of a polishing apparatus 50 which is installed in a clean room. A wall 53 with a side wall 53A partitions the clean room into a working zone 54 of a high degree of cleanliness and a utility zone 55 of a low degree of cleanliness. The side wall 53A is provided with a cassette delivery opening 51 and an operator panel 52. The polishing apparatus 50 is an enclosed structure by a housing unit comprising the side walls 53A, 53B and a ceiling 53C, and houses a load/unload section for delivering a cassette which stores a plurality of semiconductor wafers, a transfer section for transferring the semiconductor wafers, a polishing section for polishing semiconductor wafers, a cleaning unit for cleaning the semiconductor wafers which have been polished, and a control unit for controlling the operation of the overall apparatus. All of the units are mounted on a common base. The entire structure of the polishing apparatus is enclosed by the side walls 53A, 53B and the ceiling 53C, and is in the form of a box.

FIG. 4A shows an interior of the polishing apparatus 50. Although the polishing section 56, and all other sections comprising the load/unload section 57, the transfer section 58, the cleaning section 59 and the control section 60 are installed on the common base 62, the latter group of sections are isolated from the polishing section 56 by a partition wall 61. The partition wall 61 has an opening 71 which allows the semiconductor wafer 4 to pass therethrough.

FIG. 4B shows a cassette 63 having a plurality of storage shelves 67 on which semiconductor wafers 4 are placed.

As shown in FIG. 4A, the cassette 63 inserted from the cassette delivery opening 51 (see FIG. 3) is placed on a stage 64 of the load/unload section 57, and the number of semiconductor wafers 4 and the position of the storage shelves 67 are detected by means of a sensor 65, and the detected data are stored in a computer 68 in the control section 60. After the above detection is completed, a finger or arm 70 of a robot 69 disposed on the transfer section 58 takes out a semiconductor wafer 4 from the cassette 63 one by one.

The semiconductor wafer 4 taken out of the cassette 63 is caused to pass through the opening 71, shown in FIG. 4A, of the partition wall 61 while the semiconductor wafer 4 is held by the finger 70 of the robot 69. The semiconductor wafer 4 is held by the top ring 5 in the polishing section 56. The semiconductor wafer 4 held by the top ring 5 is polished by pressing the semiconductor wafer 4 against the abrasive cloth 7 on the turntable 3 while abrasive slurry is supplied onto the abrasive cloth 7.

The semiconductor wafer 4 which has been polished is transferred by the robot 69 to the cleaning section 59 having a cleaning unit 74 and a drying unit 75. After the cleaning of the semiconductor wafer 4 is completed in the cleaning unit 74, the semiconductor wafer 4 is dried in the drying unit 75. After the semiconductor wafer 4 is dried, the semiconductor wafer 4 is transferred from the cleaning section 59 by the robot 69 onto the storage shelf 67 of the cassette 63. A sequence of polishing and cleaning of the semiconductor wafer 4 is completed by the above operations, and other semiconductor wafers 4 are processed in the same way. When all of the semiconductor wafers 4 in the cassette 63 are processed, the cassette 63 containing the polished and cleaned semiconductor wafers 4 is replaced with another cassette 63 containing semiconductor wafers 4 to be polished and cleaned.

Figure 5:
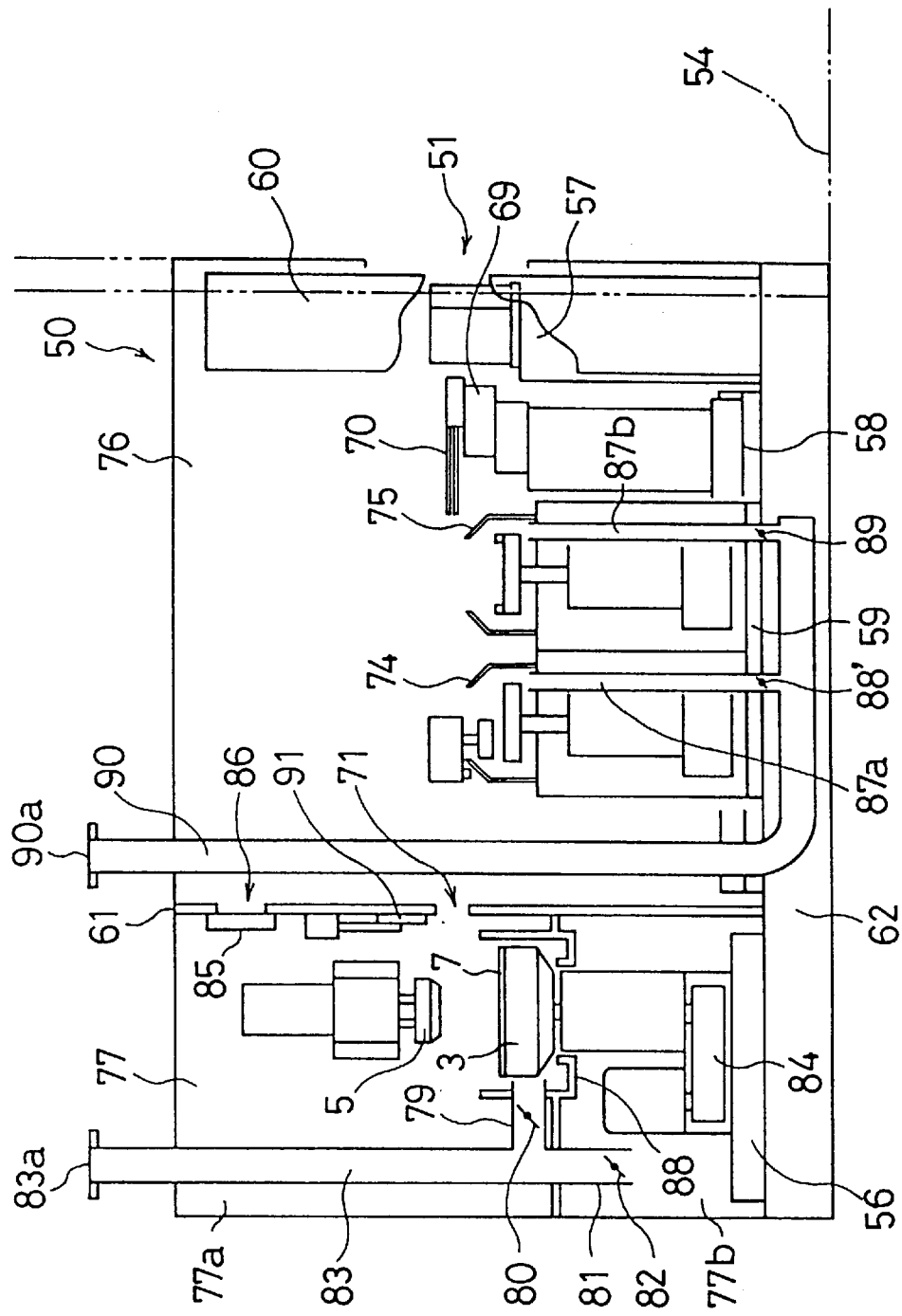
FIG. 5 is a side view showing the internal arrangement of the polishing apparatus of FIG. 3.

FIG. 5 is a side view of the interior of the polishing apparatus 50. The polishing apparatus 50 is divided by the partition wall 61 into a first chamber 77 and a second chamber 76. The polishing section 56 is disposed in the first chamber 77, and the load/unload section 57, the transfer section 58, the cleaning section 59 and the control section 60 are disposed in the second chamber 76.

Inside the first chamber 77, a trough 88 is provided around the outer periphery of the turntable 3 to prevent abrasive slurry or the like from being scattered and to collect them. The trough 88 and a wall extended from the trough 88 horizontally serve to separate the first chamber 77 into an upper chamber 77a and a lower chamber 77b. As shown in FIG. 5, the upper chamber 77a is provided with an upper duct 79 having a damper 80, and the lower chamber 77b is provided with a lower duct 81 having a damper 82. The ducts 79 and 81 are merged into a main duct 83 having an exhaust opening 83a connected to an exhaust pipe 95 (see FIG. 3) which extends from the clean room to an external environment.

The mist produced during polishing operation is exhausted from the exhaust opening 83a through the upper duct 79 and the main duct 83. The dust particles generated from the drive belt of drive section 84 for the turntable 3 are exhausted from the exhaust opening 83a through the lower duct 81 and the main duct 83. Further, the mist and the dust particles from the first chamber 77 are discharged to an external environment through the exhaust pipe 95. The partition wall 61 is provided with an opening 86, separately from the opening 71. Movable louvres 85 are provided at the opening 86 for adjusting the opening area of the opening 86.

Intake air is introduced into the upper chamber 77a in the following manner. First, air of high cleanliness from the working zone 54 is introduced into the second chamber 76 through the wafer delivery opening 51. Such air then passes through the opening 71 of the partition wall 61 and the opening 86 whose opening area is adjusted appropriately with the louvres 85, and enters the upper chamber 77a. The flow rate is regulated by adjusting the louvres 85 and the valve 80.

The amount of dust particles from the lower chamber 77b is much smaller than that of mist of the abrasive slurry from the upper chamber 77a. Therefore, only a small volume of air flows from the lower chamber 77b, thus the opening degree of the valve 82 is small to thus produce a slight negative pressure in the lower chamber 77b. A small amount of air corresponding to the exhausted air is supplied to the lower chamber 77b through a small clearance between the structural members.

The cleaning unit 74 and the drying unit 75 located in the cleaning section 59 in the second chamber 76 are provided with respective exhaust ducts 87a and 87b having adjusting valves 88' and 89, respectively. The ducts 87a and 87b are merged into a main duct 90 having an exhaust opening 90a connected to the exhaust pipe 95 (see FIG. 3). Therefore, the mist generated from the cleaning unit 74 and the drying unit 75 is exhausted from the exhaust opening 90a through the ducts 87a and 87b and the main duct 90, and is discharged to an external environment through the exhaust pipe 95. Intake air corresponding to the exhausted air is supplied from a common source of make-up air to the second chamber 76 through the wafer delivery opening 51, and the flow rate is adjusted by the valves 88 and 89.

A shutter 91 is provided at the opening 71 of the partition wall 61, and is mainly used for maintenance. When the first chamber 77 is open at the time of maintenance, the shutter 91 is closed so that the dust does not flow from the first chamber 77 to the second chamber 76 through the opening 71.

Instead of the movable louvres 85, it is possible to arrange the opening 86 so that opening area of the opening 86 can be adjusted, and a shutter may be provided to open and close the opening 86. Also, instead of a shutter, closing means such as a door may be used.

Figure 6:
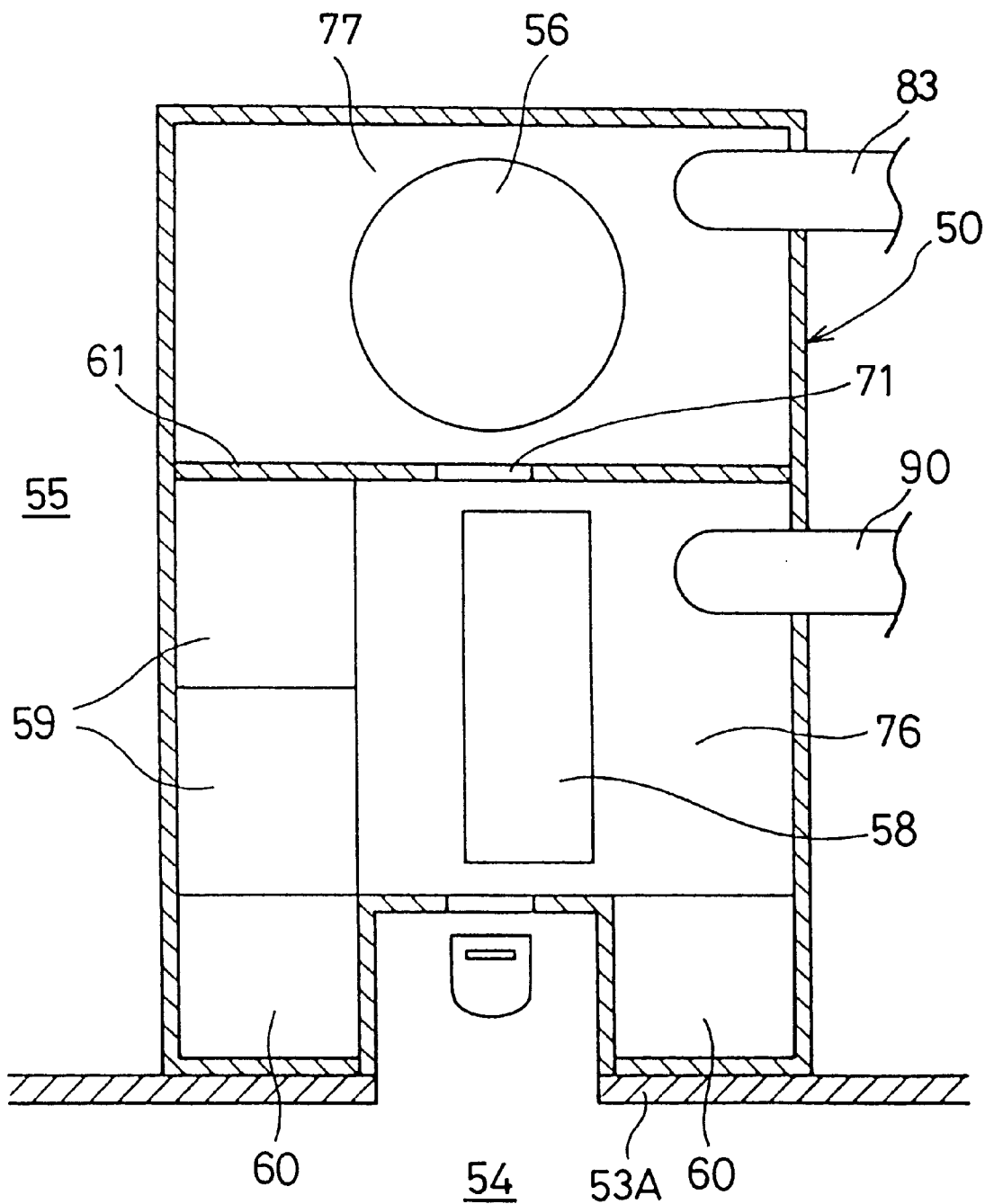
FIG. 6 is a cross-sectional plan view of the polishing apparatus of FIG. 3.

FIG. 6 is a cross-sectional plan view of the polishing apparatus 50. In the interior of the polishing apparatus 50 of a box shape, there are provided the polishing section 56, the cleaning section 59, the transfer section 58 and the control section 60 and the like. It can be seen that the polishing section 56 is located inwardly apart from the working zone 54.

The pattern of air flow through the polishing apparatus 50 will be described below with reference to FIG. 7.

The air in each of the first chamber 77 housing only the polishing section 56 and the second chamber 76 housing the cleaning section and other sections, is exhausted separately and independently so that the respective internal pressures decrease from high to low, in the order of the working zone 54 of the clean room, the second chamber 76 and the first chamber 77. The air from the first and second chambers 76 and 77 is exhausted through the main ducts 83 and 90 as shown in FIG. 7. The clean air from the working zone 54 enters the second chamber 76 having the cleaning section 59 and others, and a part of such air flows towards the main duct 90 in the second chamber 76. The other part of the clean air entering the second chamber 76 passes through the opening 71 of the partition wall 61 and enters the first chamber 77 having only the polishing section 56, and flows towards the duct 83. The flow patterns of the clean air-stream are illustrated by the arrows in FIG. 7.

Because the air is directed from the high pressure side to the low pressure side and exhausted to maintain a pressure gradient in the order of the clean room, the second chamber 76 and the first chamber 77, counterflow does not occur. It can be understood that the mist and the dust particles generated in the polishing section 56 do not flow to the clean room area, and there is no contamination of the cleaning devices because the highly contaminated ambient air does not flow from the first chamber 77 to the second chamber 76.

Further, exhausting and intaking of the ambient air of the chambers and internal pressure of the chambers in the polishing apparatus 50 are controlled by controlling the louvres 85 at the opening 86 and the valves 80, 82, 88 and 89 on the ducts 83 and 90. Therefore, the air-stream can be controlled suitably by a minimal number of control devices.

It should also be noted that the simple shape of division of the interior structure of the polishing apparatus 50 leads to fixing the direction of air-streams in the polishing apparatus and to thus make the designing of the polishing apparatus simple, and leads to a simple construction of the exhaust ducting system. Such simplified design provides high exhausting efficiency because a pressure drop which may be caused due to bends and long exhaust passages or a complex division of the interior of the polishing apparatus can be prevented.

Next, the movement of the semiconductor wafers inside the polishing apparatus 50 will be described below with reference to FIG. 8.

The semiconductor wafers from the working zone 54 are brought into the polishing apparatus 50, and pass through the second chamber 76 having the cleaning section 59 and others, and reach the first chamber 77 having the polishing section 56 to be polished. Polishing is carried out using abrasive slurry, and therefore, the polished semiconductor wafers are contaminated with residual abrasive slurry. The polished semiconductor wafers are transferred from the first chamber 77 to a cleaning device 59a in the second chamber 76. The cleaned semiconductor wafers are transferred to a cleaning device 59b to further enhance the degree of cleanliness. The cleaning unit 74 includes the cleaning devices 59a and 59b. The cleaned semiconductor wafers are dried in the cleaning device 59b, and then transferred to the working zone 54. The movement of the semiconductor wafers are shown by arrows in FIG. 8.

Figure 7:
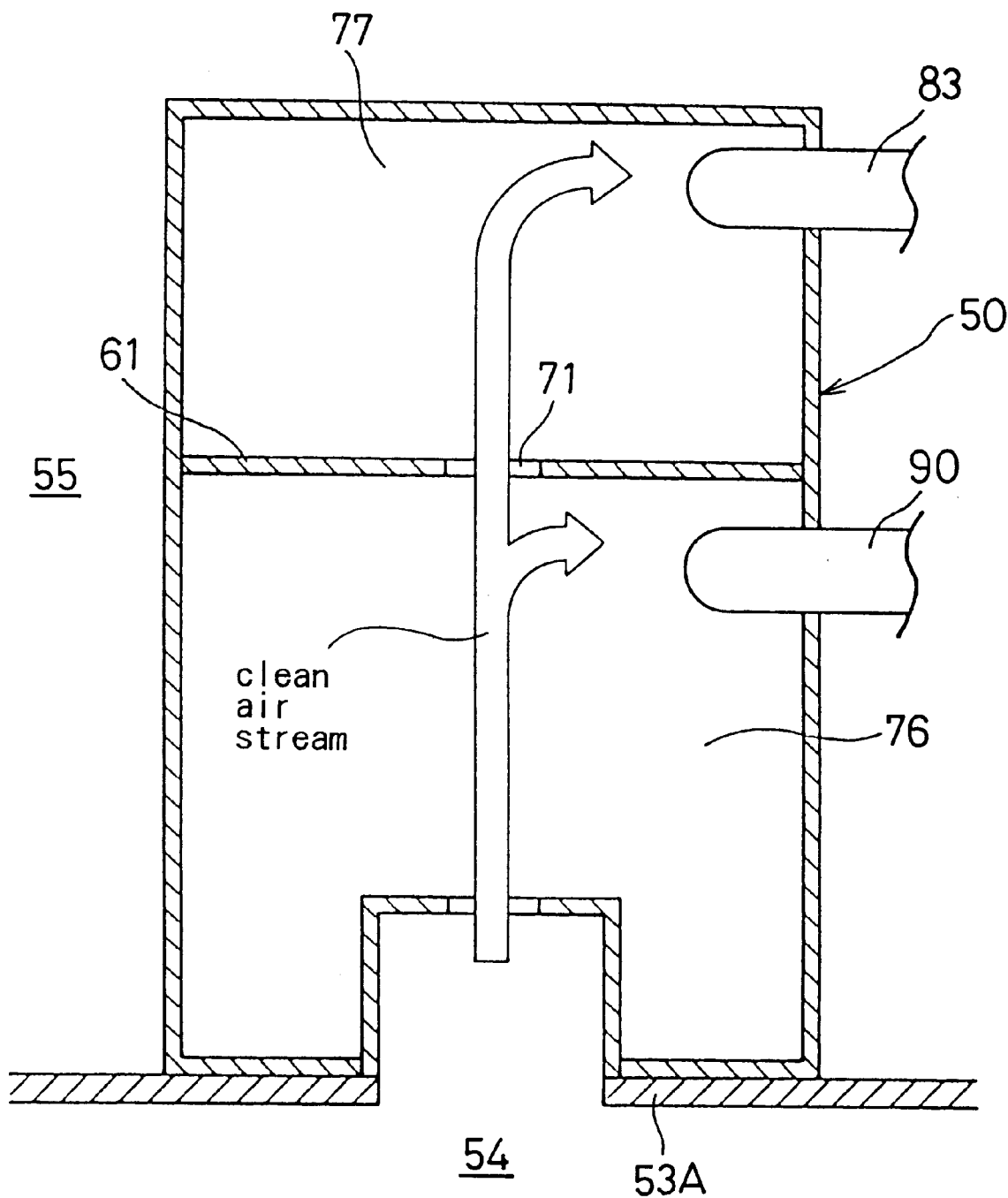
FIG. 7 is a schematic illustration showing the flow of air in the polishing apparatus of FIG. 3.
Figure 8:
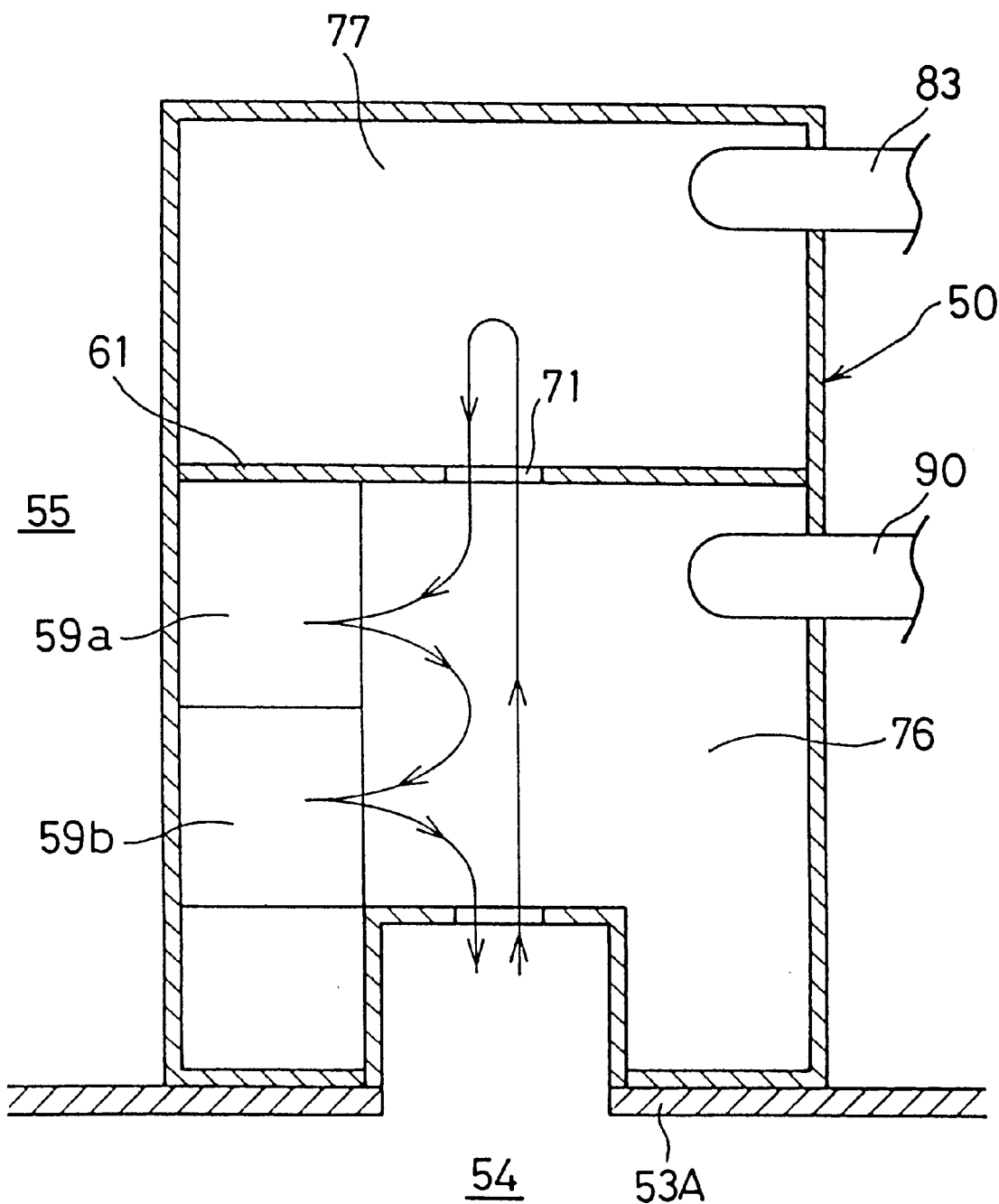
FIG. 8 is a schematic illustration showing the movement of semiconductor wafers in the polishing apparatus of FIG. 3.

As illustrated in FIGS. 7 and 8, the movement of the semiconductor wafer which is being cleaned and discharged from the polishing apparatus is counter to the air-stream, therefore transfer of the semiconductor wafer in the cleaning area is conducted in the direction of higher degree of cleanliness, thereby preventing contamination of the semiconductor wafers during the transfer step.

In order to achieve the above effect, the following considerations are given to the arrangement of the semiconductor wafer cleaning devices. When a plurality of cleaning devices are to be used, the cleaning devices providing a progressively higher degree of cleanliness should be arranged in the counter direction to the clean air-stream. In other words, when the degree of cleanliness of the semiconductor wafer provided by a cleaning device is higher, the device should be positioned at a further upstream position relative to the air-stream. In FIG. 8, this is illustrated by the positioning of the cleaning devices 59a and 59b. When a degree of cleanliness of the semiconductor wafer in the cleaning device 59b is higher than that in the cleaning device 59a, the cleaning device 59b is disposed at the upstream side of the cleaning device 59a. The same principle applies to the semiconductor wafers in transit moving between a plurality of cleaning devices.

The polishing apparatus according to the second embodiment of the present invention offers the following advantages:

(1) The clean room and the cleaning section 59 are not contaminated with the contaminants generated in the polishing section 56.

(2) The polished and cleaned semiconductor wafers or the driving components such as motors or power transmission members are not contaminated with the contaminants such as dust particles and mist produced by the polishing process.

(3) The control of air flow in each chamber can be achieved by a minimal number of control devices.

(4) The direction of the air-stream is fixed, and the design of the exhaust system is simplified.

(5) Pressure loss is minimized and high exhausting efficiency is achieved.

A polishing apparatus according to a third embodiment of the present invention will be described below with reference to FIGS. 9 and 10.

Figure 9:
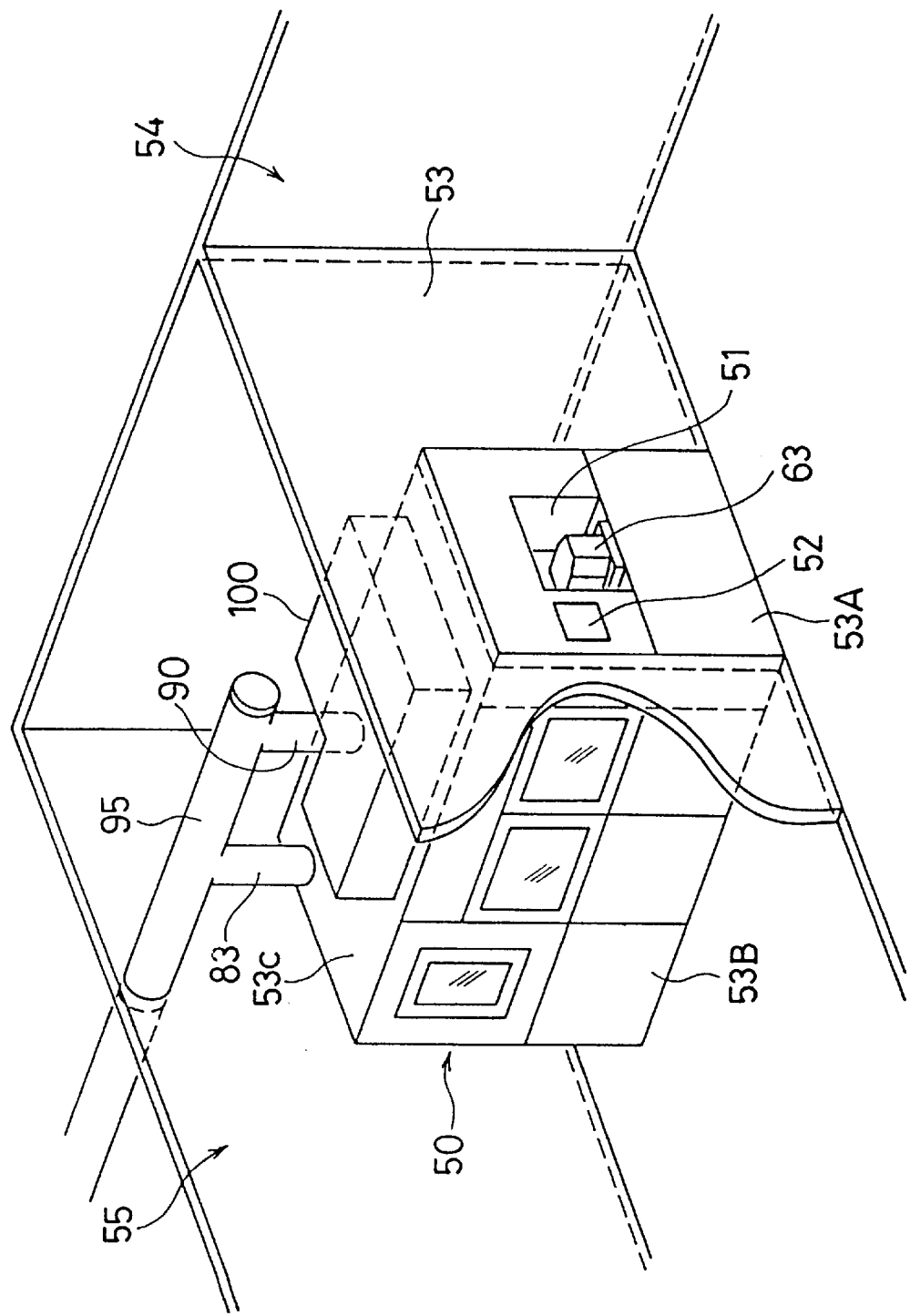
FIG. 9 is a perspective view of a polishing apparatus according to a third embodiment of the present invention.
Figure 10:
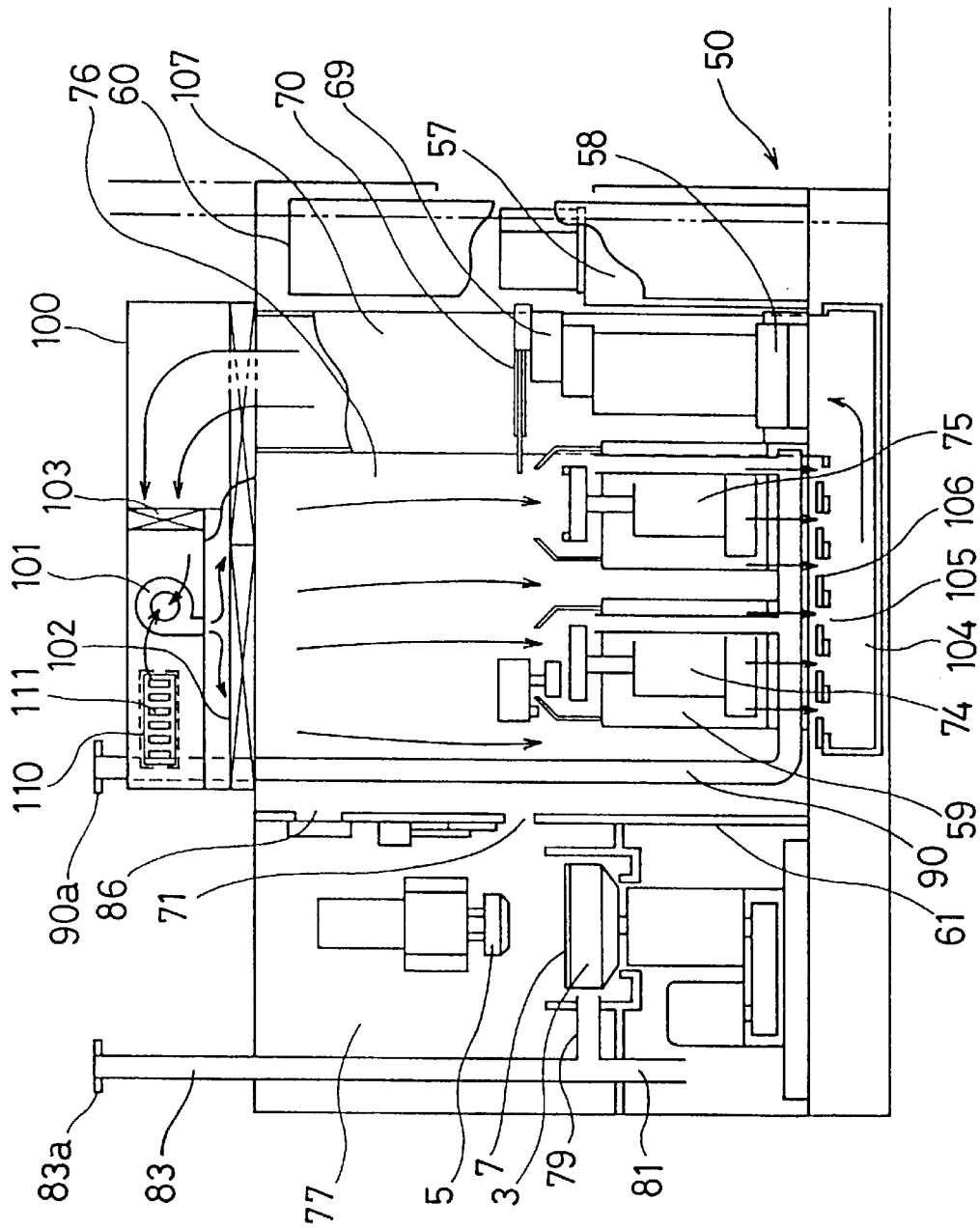
FIG. 10 is a side view showing the internal arrangement of the polishing apparatus of FIG. 9.

The polishing apparatus in FIGS. 9 and 10 is identical to the polishing apparatus in FIGS. 3 through 5 with the exception that a filtering unit 100 is provided on the ceiling 53C. Those parts shown in FIGS. 9 and 10 which are identical to those shown in FIGS. 3 through 5 are denoted by identical reference numerals, and will not be described in detail below.

As shown in FIG. 9, above the ceiling 53C, there is provided a filtering unit 100 for circulating clean air through the second chamber 76 housing the load/unload section 57, the transfer section 58 and the cleaning section 59.

FIG. 10 is a side view of the interior of the polishing apparatus 50. The polishing apparatus 50 is divided by the partition wall 61 into first chamber 77 having the polishing section 56, and second chamber 76 having the load/unload section 57, the transfer section 58, the cleaning section 59 and the control section 60.

As shown in FIG. 10, the filtering unit 100 has a fan 101, a filter 102 having a 0.1 micrometer filtering capacity disposed at the exit side of the fan 101, and a chemical filter 103 for filtering harmful gases disposed at the intake side of the fan 101. The cleaned air discharged from the filter 102 is blown down into the general area over the movement range of the robot 69 and an area including the cleaning unit 74 and the drying unit 75, i.e. over the area of the movement of the semiconductor wafers. The velocity of air flow is in the range of 0.3 to 0.4 m/s so as to be effective for preventing cross contamination of adjacently placed semiconductor wafers. A part of the air blown into the above areas flows into the first chamber 77 and respective openings of the cleaning unit 74 and the drying unit 75, but most of the air descends to the floor of the polishing apparatus 50.

The floor is provided with a box shaped duct header 104 with a flat surface. The duct header 104 has a number of openings 105 each having a louvre 106 for adjusting the opening area of the opening 105. The duct header 104 is connected to the filtering unit 100 through a duct pipe 107. The air which has descended to the floor passes through the openings 105 and flows into the duct header 104, and is introduced into the chemical filter 103 through the duct pipe 107.

Therefore, the harmful gases from the wet semiconductor wafers 17 and liquid drops which adhere to the finger 20 of the robot 19 and contain traces of abrasive slurryare removed together with the descending air flow by the chemical filter 103. The abrasive material and the ground-off particles of the semiconductor wafer which may have dripped with cleaning solvent and dried on the floor are prevented from being scattered by the descending air, and a part of such particles is removed by the filter 102.

Make-up air is mainly supplied mainly from air supply openings 111 each having a louvre 110 disposed on the filtering unit 100. A small amount of air is supplied from the cassette delivery opening 51. The descending speed of the air in the second chamber 76 can be adjusted by adjusting the louvres 106 of the duct header 104 and the louvres 110 of the air supply openings 111 for the make-up air.

FIG. 11 shows a modified embodiment of the third embodiment shown in FIGS. 9 and 10.

In this embodiment, the filtering unit 100 is removed, and the ceiling of the second chamber 76 is also removed. An exhaust fan 112 is provided at the bottom surface of the duct header 104. This type of apparatus can be used in the case where there is no generation of harmful gases from the abrasive slurry and the polishing apparatus is installed in a clean room having a relatively high cleanliness. It is possible to use only the down-flow ambient air within the clean room. The down-flow air is exhausted to an exterior environment of the polishing apparatus 50 by the exhaust fan 112. In this embodiment also, the base of the second chamber 76 is provided with numerous floor openings 105 on top of the duct header 104, and the ambient air is exhausted outside by the exhaust fan 112 through the duct header 104.

The duct header 104 does not necessarily need to be a flat pipe shapes, but pipes having other shape can also be used so long as they are capable of collecting the down-flow ambient air. Also, the operational parameters of the apparatus, such as filtering ability and the need for a chemical filter, will be dependent on a particular degree of cleanliness in the clean room and the type of abrasive slurry to be used in the polishing operation.

According to the third embodiment shown in FIGS. 9 through 11, the prevention of particulate contamination of the semiconductor wafers which have been polished and cleaned in the polishing apparatus as well as removal of harmful gases can be achieved. Therefore, the polishing apparatus can be installed in the clean room, thus removing the restrictions imposed on production conditions, such as the types of abrasive slurry, and offering a higher degree of freedom in arranging the polishing operation to handle a variety of types of surface films of the semiconductor wafers for production of a wide variety of semiconductor devices.

The polishing apparatus of the present invention can process various workpieces including a semiconductor wafer, a glass substrate and the like.

In the second and third embodiments of FIGS. 3 through 11, although the loading station and the unloading station are integrally provided, they may be independently provided.

According to the polishing apparatus of the present invention, a semiconductor wafer is polished in the polishing section, the semiconductor wafer which has been polished is transferred from the polishing section to the cleaning section, and then the semiconductor wafer is cleaned and dried in the cleaning section. Therefore, the semiconductor wafer is discharged from the polishing apparatus in such a state that the semiconductor wafer is clean and dry.

Although certain preferred embodiments of the present invention have been shown and described in detail, it should be understood that various changes and modification may be made thereto without departing from the scope of the appended claims.

What is claimed is:

1. An apparatus for polishing and then cleaning a workpiece, said apparatus comprising:

an enclosing structure having an outer wall and a partition forming at least two chambers in said enclosing structure, said partition having an opening for allowing the workpiece to pass therethrough;

a polishing section for polishing the workpiece, said polishing section being disposed in a first chamber of said at least two chambers;

a cleaning unit for cleaning the workpiece which has been polished, said cleaning unit being disposed in a second chamber of said at least two chambers;

transfer structure for transferring the polished workpiece from said polishing section through said opening to said cleaning unit;

a drying unit for drying the workpiece which has been cleaned, said drying unit being located in one of said at least two chambers other than said first chamber; and an unloading section for receiving the clean and dry polished workpiece from said drying unit.

2. The apparatus according to claim 1, further comprising exhaust means for exhausting ambient air from an interior of said enclosing structure.

3. The apparatus according to claim 2, wherein said exhaust means comprises means for exhausting ambient air from said first chamber of said at least two chambers.

4. The apparatus according to claim 2, wherein said exhaust means comprises means for exhausting ambient air from each of said first chamber of said at least two chambers and said second chamber of said at least two chambers separately and independently.

5. The apparatus according to claim 2, wherein said exhaust means forms an air flow so as to produce internal pressures which decrease from high to low in the order of said second chamber of said at least two chambers, and said first chamber of said at least two chambers.

6. The apparatus according to claim 1, wherein said polishing section comprises a turntable with an abrasive cloth mounted on an upper surface thereof and a top ring positioned above said turntable for supporting the workpiece and pressing the workpiece against said abrasive cloth.

7. The apparatus according to claim 1, wherein said drying unit comprises a spin dryer.

8. The apparatus according top claim 1, further comprising a shutter for opening and closing said opening of said partition.

9. The apparatus according to claim 1, further comprising a loading section to receive a cassette containing a plurality of workpieces to be polished;

wherein said unloading section receives a cassette which receives the workpieces which have been cleaned; and said transfer structure comprises a transferring section for removing a workpiece from a cassette at said loading section and transferring such removed workpiece.

10. The apparatus according to claim 9, wherein said loading section and said transferring section are disposed in said first chamber of said at least two chambers, and said unloading section is disposed in said second chamber of said at least two chambers.

11. The apparatus according to claim 1, wherein said transfer structure comprises a transferring device for transferring the workpiece which has been polished from said first chamber of said at least two chambers to said second chamber of said at least two chambers through said opening while the workpiece is inverted.

12. The apparatus according to claim 1, wherein said cleaning unit comprises a plurality of cleaning devices providing a progressively higher degree of cleanliness of the workpiece.

13. The apparatus according to claim 1, wherein said polishing section comprises a polishing table.

14. The apparatus according to claim 1, wherein said cleaning unit comprises a first stage cleaning unit for performing a primary cleaning of the workpiece by scrubbing the workpiece with a scrubbing member while cleaning solvent is supplied to the workpiece.

15. The apparatus according to claim 14, wherein said cleaning unit further comprises a second-stage cleaning unit for performing a secondary cleaning of the workpiece which has been subjected to primary cleaning, the secondary cleaning of the workpiece being performed by scrubbing the workpiece with a scrubbing member.

16. The apparatus according to claim 1, wherein said transfer structure comprises a robot.

17. The apparatus according to claim 1, wherein said enclosing structure has a cassette delivery opening.

18. The apparatus according to claim 1, wherein the workpiece to be polished is introduced into said first chamber through said second chamber, the workpiece which has been polished in said first chamber is transferred from said first chamber to said second chamber, and the workpiece which has been cleaned in said second chamber is discharged from said second chamber to a clean room in which said polishing apparatus is installed.

19. An apparatus for polishing and then cleaning a workpiece, said apparatus comprising:

an enclosing structure having an outer wall and a partition forming at least two chambers in said enclosing structure, said partition having a first opening for allowing a workpiece to pass therethrough;

a polishing section for polishing the workpiece, said polishing section being disposed in a first chamber of said at least two chambers;

a cleaning unit for cleaning the workpiece which has been polished, said cleaning unit being disposed in a second chamber of said at least two chambers;

transfer structure for transferring the polished workpiece from said polishing section through said first opening to said cleaning unit;

a drying unit for drying the workpiece which has been cleaned, said drying unit being located in one of said at least two chambers other than said first chamber;

an unloading section for receiving the clean and dry polished workpiece from said dryinq unit; and wherein the workpiece to be polished is introduced into said first chamber of said at least two chambers through said second chamber of said at least two chambers, the workpiece which has been polished in said first chamber of said at least two chambers is transferred from said first chamber of said at least two chambers to said second chamber of said at least two chambers, and the workpiece which has been cleaned in said second chamber of said at least two chambers is discharged from said second chamber of said at least two chambers.

20. The apparatus according to claim 19, further comprising exhaust means for exhausting ambient air from an interior of said enclosing structure.

21. The apparatus according to claim 20, wherein said polishing section comprises a turntable with an abrasive cloth mounted on an upper surface thereof and a top ring positioned above said turntable for supporting the workpiece and pressing the workpiece against the abrasive cloth.

22. The polishing apparatus according to claim 21, further comprising:
a wall provided around said turntable and extending horizontally and partitioning said first chamber of said at least two chambers into an upper chamber and a lower chamber; and
wherein said exhaust means comprises first duct means including ducts communicating with said upper chamber and said lower chamber, respectively, and each having a respective valve, and a main duct connected to said ducts and communicating with an external environment.

23. The apparatus according to claim 22, wherein said exhaust means comprises second duct means including a duct communicating with said cleaning unit and having a valve, and a main duct connected to said duct and communicating with an external environment.

24. The apparatus according to claim 19, wherein said transfer structure comprises a transferring device operable to transfer the workpiece to be polished from said second chamber of said at least two chambers to said first chamber of said at least two chambers and to transfer the workpiece which has been polished from said first chamber of said at least two chambers to said second chamber of said at least two chambers.

25. The apparatus according to claim 19, further a comprising loading section to receive a cassette containing a plurality of workpieces to be polished;
wherein said unloading section recieves a cassette which receives the workpieces which have been cleaned;
said transfer structure comprises a transferring section for removing a workpiece from a cassette at said loading section and transferring such removed workpiece; and
said loading section, said unloading section, and said transferring section are disposed in said second chamber of said at least two chambers.

26. The apparatus according to claim 19, wherein said enclosing structure has a cassette delivery opening for delivering a cassette to at least one of said loading section and said unloading section.

27. The method according to claim 19, further comprising:
a flitering unit including a fan and filtering means disposed on a ceiling section above said second chamber of said at least two chambers; and
duct means for circulating ambient air in said second chamber of said at least two chambers through said filtering unit.

28. The apparatus according to claim 27, wherein said duct means comprises a duct header disposed at a lower part of said second chamber of said at least two chambers and having a plurality of openings, and a duct which connects said filtering unit and said duct header, and further comprising means, provided at said openings of said duct header, for adjustment of ambient air flow.

29. The apparatus according to claim 27, wherein said filtering unit comprises a chemical filter disposed at an ambient air intake side of said fan.

30. The apparatus according to claim 27, wherein said filtering unit further comprises a plurality of openings for introducing make-up air into said second chamber of said at least two chambers.

31. The polishing apparatus according to claim 19, wherein said cleaning unit comprises a plurality of cleaning devices providing a progressively higher degree of cleanliness of the workpiece and arranged in a direction counter to a direction of air flow in said second chamber of said at least two chambers.

32. The apparatus according to claim 19, wherein said polishing section comprises a polishing table.

33. The apparatus according to claim 19, wherein said cleaning unit comprises a first-stage cleaning unit for performing a primary cleaning of the workpiece by scrubbing the workpiece with a scrubbing member while cleaning solvent is supplied to the workpiece.

34. The apparatus according to claim 33, wherein said cleaning unit further comprises a second-stage cleaning unit for performing a secondary cleaning of the workpiece which has been subjected to primary cleaning, the secondary cleaning of the workpiece being performed by scrubbing the workpiece with a scrubbing member.

35. The apparatus according to claim 19, wherein said drying unit comprises a spin dryer.

36. The apparatus according to claim 19, wherein said transfer structure comprises a robot.

37. The apparatus according to claim 19, wherein said enclosing structure has a cassette delivery opening.

38. The apparatus according to claim 19, wherein the workpiece to be polished is introduced into said first chamber through said second chamber, the workpiece which has been polished in said first chamber is transferred from said first chamber to said second chamber, and the workpiece which has been cleaned in said second chamber is discharged from said second chamber to a clean room in which said polishing apparatus is installed.

39. An apparatus for polishing and then cleaning a workpiece, said apparatus comprising:
an enclosing structure having an outer wall and a partition forming at least two chambers in said enclosing structure, said partition having a first opening for allowing a workpiece to pass therethrough and a second opening;
a polishing section for polishing the workpiece, said polishing section being disposed in a first chamber of said at least two chambers;
a cleaning unit for cleaning the workpiece which has been polished, said cleaning unit being disposed in a second chamber of said at least two chambers;
transfer structure for transferring the polished workpiece from said polishing section through said first opening to said cleaning unit;
a drying unit for drying the workpiece which has been cleaned;
an unloading section for receiving the clean and dry polished workpiece from said dryinq unit; and
means, provided at said second opening, for adjustment of ambient air flow through said second opening.

40. A method for polishing and then cleaning workpiece, said method comprising:
introducing said workpiece to be polished from the interior of a clean room into an enclosing structure installed in said clean room;
polishing said workpiece in one of chambers formed by a partition within said enclosing structure to form a polished workpiece, said partition having an opening;
transferring said polished workpiece through said opening formed in said partition to another of said chambers;
cleaning said polished workpiece to form a clean polished workpiece;

drying said clean polished workpiece to form a clean and dry polished workpiece;

removing said clean and dry polished workpiece from said enclosing structure to said interior of said clean room; and circulating ambient air in said another of said chambers through a filtering unit located in a ceiling of said another of said chambers.

41. The method according to claim 40, further comprising exhausting ambient air from an interior of said enclosing structure.

42. The method according to claim41, wherein said exhausting comprises forming an air flow so as to produce internal pressures that decrease from high to flow in the order of said another of said chambers and said one of said chambers.

43. The method according to claim 41, further comprising exhausting ambient air from each of said one of said chambers and said another of said chambers separately and independently.

44. The method according to claim 40, further comprising:

transferring said workpiece to be polished from a loading section to a polishing section disposed in said one of said chambers; and transferring said clean and dry polished workpiece to an unloading section.

45. The method according to claim 44, wherein transferring said polished workpiece from said polishing section through said opening to said another of said chambers comprises inverting said polished workpiece.

46. The method according to claim 40, wherein said polishing is carried out by pressing said workpiece by a top ring against an abrasive cloth mounted on an upper surface of a turntable.

47. The method according to claim 40, wherein said drying comprises sin drying said clean polished workpiece.

48. The method according to claim 40, wherein said polishing is carried out by pressing the workpiece by a top ring against a polishing table.

49. The method according to claim 40, wherein said cleaning comprises performing a primary cleaning of the workpiece by scrubbing the workpiece with a scrubbing member while cleaning solvent is supplied to the workpiece.

50. The method according to claim 49, wherein said cleaning further comprises performing a secondary cleaning of the workpiece which has been subjected to said primary cleaning, said secondary cleaning of the workpiece being performed by scrubbing the workpiece with a scrubbing member.

51. The method according to claim 41, wherein said drying comprises sin drying said clean polished workpiece.

52. The method according to claim 40, wherein said transferring is conducted by a robot.

53. The method according to claim 52, further comprising exhausting ambient air from an interior of said enclosing structure.

54. The method according to claim 53, wherein said polishing is carried out by pressing said workpiece by a top ring against an abrasive cloth mounted on an upper surface of a turntable.

55. The method according to claim 54, wherein said one of said chambers is partitioned into upper and lower chambers, and further comprising exhausting ambient air from each of said upper and lower chambers through respective ducts, and discharging the thus exhausted ambient air to an external environment.

56. The method according to claim 53, wherein said exhausting comprises forming an air flow so as to produce internal pressures that decrease from high to low in the order of said clean room in which said enclosing structure is installed, said another of said chambers and said one of said chambers.

57. The method according to claim 52, further comprising transferring said polished workpiece at a cleaning unit disposed in said another of said chambers in a direction counter to a direction of air in said another of said chambers.

58. The method according to claim 52, further comprising:

transferring a workpiece from a loading section to a polishing section disposed in said one of said chambers of said enclosing structure; and transferring a workpiece from a laoding section to a polishing section disposed in said one of said chmabers of said enclosing structure; and transferring said clean and dry polished workpiece to an unloading section.

59. The method according to claim 52, wherein said polishing is carried out by pressing the workpiece by a top ring against a polishing table.

60. The method according to claim 52, wherein said cleaning comprises performing a primary cleaning of the workpiece by scrubbing the workpiece with a scrubbing member while cleaning solvent is supplied to the workpiece.

61. The method according to claim 60, wherein said cleaning further comprises performing a secondary cleaning of the workpiece which has been subjected to said primary cleaning, said secondary cleaning of the workpiece being performed by scrubbing the workpiece with a scrubbing member.

62. The method according to claim 52, wherein said drying comprises spin drying said clean polished workpiece.

63. The method according to claim 52, wherein said transferring is conducted by a robot.

* * * * *

UNITED STATES PATENT AND TRADEMARK OFFICE
CERTIFICATE OF CORRECTION

PATENT NO.    : 6,500,051 B1
DATED         : December 31, 2002
INVENTOR(S)   : Toyomi Nishi et al.

It is certified that error appears in the above-identified patent and that said Letters Patent is hereby corrected as shown below:

Column 13,
Line 46, change "top" to -- to --.

Column 14,
Line 8, change "first stage" to -- first-stage --.
Line 34, change "a first" to -- an --; and
Line 43, delete "first".

Column 15,
Line 2, change "the abrasive" to -- said abrasive --.
Line 28, after "further" delete "a"; and
Line 29, after "prising" insert -- a --.
Line 39, change "19" to -- 25 --.
Line 45, change "method" to -- apparatus --.

Column 16,
Line 52, change "dryinq" to -- drying --.
Line 55, before "workpiece" insert -- a --;

Column 17,
Line 2, change "workpiece;" to -- workpiece; and --;
Line 5, delete "; and"; and
Lines 6-8, delete "circulating ambient air in said another of said chambers through a filtering unit located in a ceiling of said another of said chambers".
Line 12, change "claim41" to -- claim 41 --; and
Line 14, change "flow" to -- low --.
Line 37, change "sin" to -- spin --.
Delete lines 51-52, and add -- The method according to claim 40, wherein said transferring is conducted by a robot. --.

UNITED STATES PATENT AND TRADEMARK OFFICE
CERTIFICATE OF CORRECTION

PATENT NO.     : 6,500,051 B2
DATED          : December 31, 2002
INVENTOR(S)    : Toyomi Nishi et al.

It is certified that error appears in the above-identified patent and that said Letters Patent is hereby corrected as shown below:

<u>Column 18,</u>
Delete lines 1-2, and add:
-- A method for polishing and then cleaning workpiece, said method comprising:
introducing said workpiece to be polished from the interior of a clean room into an enclosing structure installed in said clean room;
polishing said workpiece in one of chambers formed by a partition within said enclosing structure to form a polished workpiece, said partition having an opening;
transferring said polished workpiece through said opening formed in said partition to another of said chambers;
cleaning said polished workpiece to form a clean polished workpiece;
drying said clean polished workpiece to form a clean and dry polished workpiece;
removing said clean and dry polished workpiece from said enclosing structure to said interior of said clean room; and
circulating ambient air in said another of said chambers through a filtering unit located in a ceiling of said another of said chambers. --.
Line 25, after "air" insert -- flow --.
Lines 30-32, delete "transferring a workpiece from a loading section to a polishing section disposed in said one of said chmabers of said enclosing structure; and".

Signed and Sealed this

Fifth Day of August, 2003

JAMES E. ROGAN
*Director of the United States Patent and Trademark Office*